United States Patent [19]

Goldie

[11] Patent Number: 4,737,754

[45] Date of Patent: Apr. 12, 1988

[54] METHOD OF OPERATING AN ELECTROMAGNETIC ARRANGEMENT

[75] Inventor: Frederick T. D. Goldie, London, England

[73] Assignee: Picker International, Ltd., Wembley, England

[21] Appl. No.: 75,669

[22] Filed: Jul. 20, 1987

[30] Foreign Application Priority Data

Aug. 4, 1986 [GB] United Kingdom ............... 8619012

[51] Int. Cl.⁴ ............................................. H01K 5/00
[52] U.S. Cl. .................................... 335/299; 324/320
[58] Field of Search ............... 335/299; 324/318, 319, 324/320, 321

[56] References Cited

U.S. PATENT DOCUMENTS 4,523,166  6/1985  Gross ............................. 324/320 X
4,646,024  2/1987  Schenck et al. .................... 324/318
4,680,551  7/1987  O'Donnell et al. ................. 324/320

FOREIGN PATENT DOCUMENTS 2155642  9/1985  United Kingdom ............... 335/299

*Primary Examiner*—George Harris
*Attorney, Agent, or Firm*—Timothy B. Gurin

[57] ABSTRACT

A method of operating an electromagnet arrangement comprising a main electromagnet and a number of correction coils for applying correction fields to the field produced by the main electromagnet to produce a resultant desired homogeneous magnetic field in a given volume. The method comprises obtaining the least squares fit values for the correction coil currents and, if the required current in any coil lies outside a range of permissible values for that coil current, following a special procedure to find the best selection of coil currents consistent with the permissible currents in the coils.

4 Claims, 1 Drawing Sheet

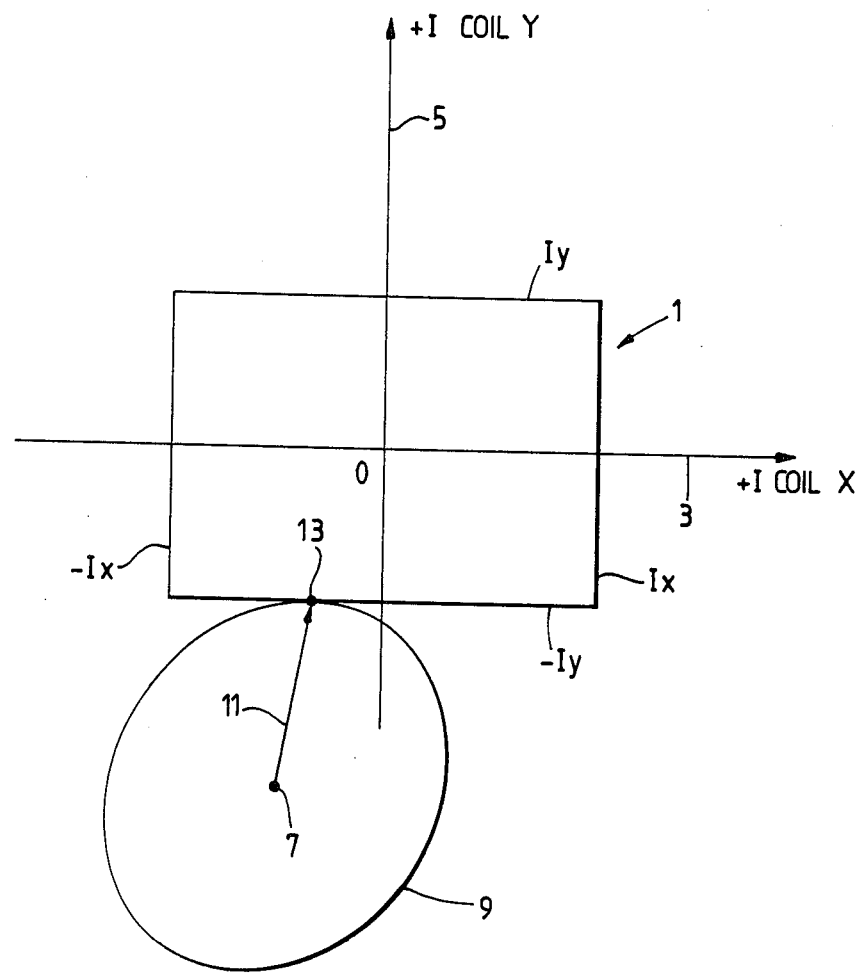

METHOD OF OPERATING AN ELECTROMAGNETIC ARRANGEMENT

This invention relates to electromagnet arrangements.

More particularly the invention relates to electromagnet arrangements for producing a magnetic field of high homogeneity in a volume, such as is required, for example, in nuclear magnetic resonance imaging apparatus to establish an equilibrium axis of magnetic alignment in a body being imaged.

Such electromagnet arrangements conventionally comprise a main electromagnet, together with a number of correction coils. Typically the arrangement is of cylindrical form and the correction coils include both axisymmetric coils and transverse correction coils. The axisymmetric coils are generally disposed in a helical pattern on a cylindrical coil former and the transverse correction coils in a so-called saddle shape on the former.

In use of such an electromagnet arrangement various methods have been employed for calculating the best values for the correction coil currents. One such method comprises calculating the values of the coil currents required to minimise the sum of the squares of the difference between a desired correction field and the correction field produced by the current values so calculated at each point of a number of points in a volume of interest. Such a procedure is known as obtaining the least squares fit values for the correction coil currents.

However, when this has been done, it is often found that the current required in one or more of the correction coils is outside the permissible range of value for the current in that coil. Consequently some procedure is required to find the best selection of coil currents consistent with the permissible currents in the coils.

It is an object of the present invention to provide such a procedure.

According to the present invention a method of operating an electromagnet arrangement comprising a main electromagnet together with a number of correction coils intended to apply correction fields to the field produced by the main electromagnet to produce a resultant desired homogeneous magnetic field in a given volume comprises the steps of: calculating the values of the currents in the correction coils required to give the least possible value for the sum of the squares of the difference between a desired correction field and the correction field given by the coil currents so calculated at each of a number of points in said volume; and if any of the coil current values so calculated is outside a predetermined permissible range of value for that coil current; determining whether for the least increase of said sum over said least possible value which is possible when any one coil current has a respective limit permissible value, the other coil currents all have values within their respective permissible ranges of value, and if they do, setting the coil currents at the values giving the smallest increase of said sum; and if they do not, repeating the determination for any two coil currents having respective limit permissible values, and then for any three coil currents having respective limit permissible values, and so on, until a said setting of the coil currents is permissible.

One method in accordance with the invention will now be described by way of example with reference to the accompanying drawing which is a diagram illustrating a step of the method.

The method comprises a procedure for setting up an electromagnet arrangement comprising a main electromagnet and a number of correction coils so as to optimise the homogeneity of the field in an arbitrarily chosen volume within the magnet arrangement. The procedure is especially suitable for use with electromagnet arrangements for use in nuclear magnetic resonance imaging apparatus. In such apparatus the electromagnet arrangement is conventionally designed to produce a field of maximum homogeneity around the magnet isocentre. The method provided by the invention enables highly homogeneous fields to be produced in a region of interest of a body being examined displaced from the magnet isocentre.

In carrying out the method, the first step is to define a region of interest. For example, a cube of side 10 cms is used. The uncorrected field at a regular grid of points in the region of interest is measured, or calculated from an existing field analysis. A 6 by 6 cubic grid of points is typically used given 216 points in all.

To obtain an expression for the correction field due to the correction coils at each point, we collect all the spatial variation into one label i, denoting a point, and distinguish individual correction coils by the label q, thus obtaining an expression of the correction fields at each point:

$$B(\text{corr}) = \sum_i a(q) f(i,q)$$

where a (q) is the current in coil q, and f (i,q) is shorthand for the field generated at point i by unit current in coil q.

The coefficients a(q) are to be chosen to minimise the squared deviation ($\epsilon^2$) of the desired correction field ($B_i$) for field homogeneity from the actual correction field. That is $$\epsilon^2 = \sum_i (B_i - B(\text{corr}))^2$$

$$= \sum_i \left( B_i - \sum_q a(q) f(i,q) \right) \left( B_i - \sum_p a(p) f(i,p) \right)$$

must be minimised with respect to the a(q).

When minimised, the partial derivative of $\epsilon^2$ with respect to each of the a(q) will be zero. This leads to a set of linear equations in the a(q) which can be solved by standard matrix methods. To be specific, minimise with respect to one term, a(s).

$$\frac{\partial(\epsilon^2)}{\partial(a(s))} = \sum_i \left( -2B_i f(i,s) + 2f(i,s) \sum_q a(q) f(i,q) \right) = 0$$

In matrix terms, the equation to be solved is:

$$\underline{\underline{F}}\underline{a} = \underline{b}$$
where
$$\underline{\underline{F}}_{qs} = \Sigma f(i,q) f(i,s)$$
$$\underline{a}_s = a(s) \quad \underline{b}_q = \Sigma_i B_i f(i,q)$$

The corrections to the various coil currents are computed, and the new r.m.s. error in field is computed from the matrix components.

It can readily be shown that the third and higher partial derivatives of the squared error with respect to the fitting parameters are zero. Therefore the squared error can be expressed exactly as a Taylor series about its absolute minimum, as determined above. Only second derivatives are involved, and the expression for the squared error as a function of vector displacement $\underline{r}$ from the absolute minimum is an n-dimensional quadratic form involving no linear terms. The coefficients are contained in the fitting matrix $\underline{\underline{F}}$ above:

$$\epsilon^2 = \tilde{\underline{r}}\underline{\underline{F}}\underline{r} + \text{constant}$$

Contours of constant squared error have the form of n-dimensional ellipsoids. Our task is to seek a compromise fit, subject to the current limitations of the correction coils.

To obtain the compromise fit the surface of an n-dimensional constraining box defining the limits of the permissible currents in the correction coils must be searched for the smallest ellipsoid to touch it. As a first guess, assume that a solution exists in which only one coil is driven to its limits. The compromise fit will be the ellipsoid that is tangential to the appropriate surface of constrained current, i.e. the normal to the ellipsoid, given by the grad of $\epsilon^2$, will be parallel to the unit basis vector $\hat{i}_m$ for the constrained current. Using subscript notation, and the symmetry of array $\underline{\underline{F}}$, $$(\nabla \epsilon^2)_k = \frac{\partial}{\partial r_k}(r_i F_{ij} r_j) = \delta_{km}$$
$$=> 2F_{kj} r_j = \delta_{km}$$
$$=> r_j = \tfrac{1}{2} F_{jk}^{-1} \delta_{km}$$

The vector $\underline{r}$ is proportional to the mth column of the inverse of $\underline{\underline{F}}$. We call this the "tangent vector" corresponding to this constraint.

This technique can be generalised to the case where several currents are saturated together. Write $$\underline{r} = \underline{k} + \underline{x}$$

where $\underline{k}$ is a constant vector and $\underline{x}$ contains the remaining currents that are free to vary. If a component of $\underline{k}$ is non-zero, the corresponding component of $\underline{x}$ is fixed at zero.

$$\underline{k} = (0, 0, k_3, 0, \ldots k_m, \ldots 0)$$
$$\underline{x} = (x_1, x_2, 0, x_4, \ldots 0, \ldots x_n)$$

We attempt to minimise $\epsilon^2$.

$$\epsilon^2 = \widetilde{(\underline{k}+\underline{x})} \underline{\underline{F}} (\underline{k}+\underline{x}) + \text{constant}$$

Using subscript notation, differentiate with respect to each of the components that are free to vary. At a constrained minimum, $$\frac{\partial(\epsilon^2)}{\partial x_j} = 0 \text{ for all } x_j \text{ that are free to vary}$$
$$=> F_{ij} k_j + F_{ij} x_j = 0$$

This result may be expressed in words: In the constrained solution, the grad of $\epsilon^2$ has no components parallel to the unconstrained currents. Therefore any such proposed solution may be expressed as a linear combination of the tangent vectors found above for the constrained terms.

The search for an acceptable constrained solution is performed by first fixing just one current at its maximum or minimum, searching for the constrained minimum of $\epsilon^2$ and checking whether the remaining currents are within bounds. If so, the solution is provisionally accepted. If not, it is rejected. This is repeated for all the constraints in turn. If more than one is acceptable, the solution with the lowest squared error is chosen, and if none are acceptable the process is repeated with two coil currents at a time set at maximum or minimum, and then three coil currents, and so on.

It is unnecessary, however, to perform the least squares fitting process each time. Instead the linear combination of tangent vectors satisfying the chosen set of limit currents may be found by solving a set of linear equations. There are as many equations as there are limit currents, so that the search is rapid at first. Normally the search terminates before the slower case of many limit currents needs to be considered.

The squared error in each case is most readily found using the eigenvectors and eigenvalues of the fitting matrix. The vector from the centre of the ellipsoid representing the compromise fit is resolved into eigenvector components, and the squared error is expressed as:

$$\epsilon^2 = \Sigma_r \lambda_r v_r^2$$

where the $\lambda_r$ are the eigenvalues, and the $v_r$ are the eigenvector components of the compromise fitting vector.

Since the technique starts with one current constraint and works upwards, it is far preferable to the alternative of explicit least-squares fitting, which would involve starting with an $(n-1)$ by $(n-1)$ problem and working down.

A further advantage of the technique is that the matrix $\underline{\underline{F}}$ only needs to be inverted once, and that, having computed the eigenvectors and eigenvalues of $\underline{\underline{F}}$, the search of the constraining surface can be performed without explicit re-fitting. Hence the technique is potentially faster than empirical methods of homogeneity enhancement, being a one-shot computed solution to the problem.

The above described procedure may be visualised by considering the case of just two correction coils.

Referring to the drawing, the rectangle 1 defines the maximum permissible currents in the two coils, the lines 3 and 5 being the current axes for the two coils X and Y. Thus the current in coil X must be between limits indicated by lines $I_x$ and $-I_x$ amd the current in coil Y between limits indicated by lines $I_y$ and $-I_y$.

A point 7 indicates the currents required in coils X and Y to give the least possible value of the squared error $\epsilon^2$, and shows that both these currents are outside the permissible limits.

The contours of constant increase of $\epsilon^2$ over the least possible value of $\epsilon^2$ are ellipsoids centred on point 7, such as ellipsoid 9.

The minimum possible increase of $\epsilon^2$ with the current in coil Y at limit $-I_y$ is given the ellipsoid 9 which is tangential to the line $-I_y$, line 11 indicating the required changes in the currents in coils X and Y to achieve this condition, i.e. the tangent vector corresponding to the constraint. The current in coil X at tangent point 13 is within limits, and the currents in coils X and Y are therefore set at the values indicated by point 13.

It will be appreciated that further ellipsoids (not shown) can be drawn tangential to all of the other current limit lines $I_y$, $I_x$ and $-I_x$, but all of these either give a value of $\epsilon^2$ higher than that given by ellipsoid 9 or require a coil current value outside permissible limits.

I claim:

1. A method of operating an electromagnet arrangement comprising a main electromagnet together with a number of correction coils for applying correction fields to the field produced by the main electromagnet to produce a resultant desired homogeneous magnetic field in a given volume, the method comprising the steps of: calculating the values of the currents in the correction coils required to give the least possible value for the sum of the squares of the difference between a desired correction field and the correction field given by the coil currents so calculated at each of a number of points in said volume; and if any of the coil current values so calculated is outside a predetermined permissible range of value for that coil current; determining whether for the least increase of said sum over said least possible value which is possible when any one coil current has a respective limit permissible value, the other coil currents all have values within their respective permissible ranges of value, and if they do, setting the coil currents at the values giving the smallest increase of said sum; and if they do not, repeating the determination for any two coil currents having respective limit permissible values, and then for any three coil currents having respective limit permissible values, and so on, until a said setting of the coil currents is permissible.

2. A method according to claim 1 wherein said least possible value for the sum of the squares is calculated using eigenvectors and eigenvalues of a fitting matrix for a set of equations defining said sum of the squares.

3. A method according to claim 1 wherein said electromagnet arrangement is designed to produce a field of maximum homogeneity around the electromagnet isocentre and said given volume is displaced from said isocentre.

4. A method according to claim 1 wherein said electromagnet arrangement comprises an electromagnet arrangement in a nuclear magnetic resonance imaging apparatus for establishing an equilibrium axis of magnetic alignment in a body being imaged.

* * * * *